(12) United States Patent
Shimura et al.

(10) Patent No.: US 7,746,337 B2
(45) Date of Patent: Jun. 29, 2010

(54) INVERTER CIRCUIT

(75) Inventors: Tatsuhisa Shimura, Tokyo (JP);
Takashi Kinoshita, Tokyo (JP); Osamu Sengoku, Tokyo (JP)

(73) Assignee: Samsung Electronics Co., Ltd. (KR)

( * ) Notice: Subject to any disclaimer, the term of this patent is extended or adjusted under 35 U.S.C. 154(b) by 901 days.

(21) Appl. No.: 11/450,770

(22) Filed: Jun. 9, 2006

(65) Prior Publication Data
US 2007/0109817 A1    May 17, 2007

(30) Foreign Application Priority Data
Nov. 17, 2005  (KR) ..................... 10-2005-0109996

(51) Int. Cl.
*G09G 5/00* (2006.01)
(52) U.S. Cl. .................. 345/211; 345/102; 363/16
(58) Field of Classification Search ............... 345/102, 345/211; 315/97, 101, 141–145, 174, 206; 363/16, 21.1, 21.11, 31, 37, 80, 131, 133
See application file for complete search history.

(56) References Cited
U.S. PATENT DOCUMENTS
6,717,372 B2 *  4/2004  Lin et al. ................. 315/282
7,141,935 B2 *  11/2006  Ushijima et al. ......... 315/209 T
7,315,464 B2 *  1/2008  Sawada et al. ............ 363/159

FOREIGN PATENT DOCUMENTS

| JP | 10-164861 | 6/1998 |
|---|---|---|
| JP | 2001-136749 A | 5/2001 |
| JP | 2003-168585 | 6/2003 |
| JP | 2003-257691 | 9/2003 |

* cited by examiner

*Primary Examiner*—Jimmy H Nguyen
(74) *Attorney, Agent, or Firm*—Cantor Colburn LLP

(57) ABSTRACT

An inverter circuit includes a first driving transformer, a second driving transformer, a power voltage circuit, a high-side FET connected to a secondary winding of the first driving transformer, a low-side FET connected to a secondary winding of the second driving transformer and an inverter transformer connected to a driving node between the high-side FET and the low-side FET. Thus, a direct current path does not exist between a gate of the high-side FET and the driving node, so that a gate voltage of the high-side FET is biased more to a negative polarity.

21 Claims, 11 Drawing Sheets

US 7,746,337 B2

INVERTER CIRCUIT

This application claims priority to Korean Patent Application No. 2005-109996, filed on Nov. 17, 2005, and all the benefits accruing therefrom under 35 U.S.C. §119, and the contents of which in its entirety are herein incorporated by reference.

BACKGROUND OF THE INVENTION

1. Field of the Invention

The present invention relates to an inverter circuit. More particularly, the present invention relates to an inverter circuit driving a backlight for a liquid crystal display.

2. Description of the Related Art

A cold cathode fluorescent lamp ("CCFL") is widely used as a backlight for a liquid crystal display. The CCFL has two terminals and emits light when an alternating current voltage having a few thousand volts is applied to the two terminals. However, a direct current voltage is required to drive the liquid crystal display, while an alternating current voltage of 100 volts~220 volts is applied from an exterior. Thus, the alternating current voltage from the exterior is converted into a direct current voltage. An inverter transformer in the liquid crystal display is driven by the direct current voltage inputted through a primary winding thereof and outputs a boosted alternating current voltage through a secondary winding thereof to drive the CCFL.

The inverter circuit is used to drive the primary winding of the inverter transformer and has a low-voltage field effect transistor ("FET") and a high-side FET that are electrically connected between a ground and a direct current voltage terminal in parallel. The high-side FET and the low-side FET are alternately turned on.

For example, an inverter circuit having the low-side FET and the high-side FET is disclosed in Japanese Laid-Open Patent Application 2001-136749. However, the high-side FET and the low-side FET of the inverter circuit disclosed in the Japanese Laid-Open Patent Application 2001-136749 have a different polarity from each other. That is, the low-side FET is an N-channel type FET, while the high-side FET is a P-channel type FET. As is well known, the P-channel type FET uses holes having a lower mobility than electrons of the N-channel type FET. As a result, the P-channel type FET is not suitable for a high-speed switching environment and has a lower driving capability than that of the N-channel type FET. Therefore, the P-channel type FET is not used for a high voltage of about 500 volts.

FIG. 1 is a circuit schematic diagram showing a conventional inverter circuit employing an N-channel type FET as the low-side FET and the high-side FET. FIG. 2 is a waveform diagram showing gate voltages of the N-channel type FETs shown in FIG. 1.

Referring to FIG. 1, first and second control signal generating circuits 1001 and 1002, respectively, output square pulses that are complementary to each other and do not overlap each other. Outputs of the first and second control signal generating circuits 1001 and 1002 are connected to primary windings of first and second driving transformers 1003 and 1004, respectively. A power voltage circuit 1005 generates a direct current voltage. An N-channel type field effect transistor (an N-channel type FET) 1006 for a high voltage and an N-channel type FET 1007 for a low voltage are connected between the power voltage circuit 1005 and a ground. A node between the high-side FET 1006 and the low-side FET 1007 is defined as a driving node 1006a. The high-side FET 1006 has a gate connected to a secondary winding of the first driving transformer 1003 and the low-side FET 1007 has a gate connected to a secondary winding of the second driving transformer 1004. The driving node 1006a between the high-side FET 1006 and the low-side FET 1007 is connected to a primary winding of an inverter transformer 1008, and a secondary winding of the inverter transformer 1008 is connected to cold cathode fluorescent lamps (CCFLs, not shown). A capacitor 1011 is connected between the first driving transformer 1003 and the gate of the high-side FET 1006, a capacitor 1012 is connected between the second driving transformer 1004 and the gate of the low-side FET 1007, and a capacitor 1013 is connected between the driving node 1006a and the primary winding of the inverter transformer 1008.

In general, the inverter circuit shown in FIG. 1 includes a first clamp circuit 1009 connected between the gate of the high-side FET 1006 and a source of the high-side FET 1006 (driving node 1006a) and a second clamp circuit 1010 connected between the gate of the low-side FET 1007 and a source of the low-side FET 1007 (ground 1007a).

The inverter circuit shown in FIG. 1 is operated as follows.

When the first and second control signal generating circuits 1001 and 1002 generate the square pulses, the square pulses are applied to the secondary windings of the first and second driving transformers 1003 and 1004, respectively. As a result, the high-side FET 1006 and the low-side FET 1007 are alternately turned on and the power voltage from the power voltage circuit 1005 and the ground voltage from the ground 1007a are alternately applied to the driving node 1006a. That is, an alternating current having an amplitude between the power voltage and the ground voltage is applied to the primary winding of the inverter transformer 1008. The inverter transformer 1008 outputs a boosted alternating current in response to the alternating current through the secondary winding thereof to drive the CCFLs.

The first and second clamp circuits 1009 and 1010 are employed to apply a positive voltage to the high-side FET 1006 and the low-side FET 1007, respectively.

However, a conventional transformer has a parasitic capacitance between primary and secondary windings thereof, and the parasitic capacitance causes many problems.

As shown in FIG. 2, the gate voltage of the high-side FET 1006 (a potential difference between the source and the gate of the high-side FET 1006) and the gate voltage of the low-side FET 1007 (a potential difference between the source and the gate of the low-side FET 1007) are not lowered below a predetermined negative voltage due to the first and second clamp circuits 1009 and 1010. The gate of the high-side FET 1006 receives a positive square pulse applied from the first driving transformer 1003 and the gate of the low-side FET 1007 also receives a positive square pulse applied from the second driving transformer 1004. When the low-side FET 1007 is turned on, the voltage level at the driving node 1006a is rapidly lowered to the ground voltage level. However, due to the parasitic capacitance, the gate voltage level of the high-side FET 1006 does not easily follow the lowering of the source thereof. As a result, the gate voltage of the high-side FET 1006 has the positive voltage level momentarily, so that the high-side FET 1006 is turned on. Thus, since the low-side FET 1007 is already turned on when the high-side FET 1006 is momentarily turned on, a shoot-through current flows through the high-side FET 1006 and the low-side FET 1007 due to the parasitic capacitance.

As a result, an output voltage level of the power voltage circuit 1005 is varied when the power voltage circuit 1005 generates the direct current voltage and the high-side FET 1006 and the low-side FET 1007 are overheated. Thus, the efficiency of the FETs 1006 and 1007 is deteriorated, thereby increasing power consumption.

BRIEF SUMMARY OF THE INVENTION

The present invention provides an inverter circuit capable of preventing a shoot-through current.

In exemplary embodiments of the present invention, an inverter circuit includes a first transformer having a primary winding to which a first control signal is applied, a second transformer having a primary winding to which a second control signal is applied, a power voltage circuit, a first field effect transistor, a second field effect transistor and a third transformer.

The power voltage circuit generates a predetermined direct current voltage. The first field effect transistor is electrically connected between the power voltage circuit and a driving node and has a gate connected to a secondary winding of the first transformer. The second field effect transistor is electrically connected between the driving node and a ground and has a gate connected to a secondary winding of the second transformer. The third transformer is electrically connected to the driving node. A voltage level applied to the gate of the first field effect transistor is maintained in a minus voltage level compared to a voltage level at the driving node during one cycle of the first control signal such that no direct current path exists between the gate of the first field effect transistor and the driving node. Since the direct current path does not exist between the gate of the first field effect transistor and the driving node, the gate voltage of the first field effect transistor is biased more to a negative polarity, thereby securing a margin with respect to the shoot-through current when the second field effect transistor is turned on.

An absolute value of the minus voltage level increases as a pulse width of the first control signal increases. A capacitor may be electrically connected between a primary winding of the third transformer and the driving node. A first impedance converting circuit and a first resistor may be connected in series between the secondary winding of the first transformer and the gate of the first field effect transistor. The first impedance converting circuit makes an impedance of the first transformer lower than an impedance of the first resistor.

The first impedance converting circuit is a push-pull circuit having a first impedance converting transistor and a second impedance converting transistor connected to each other in series. Input terminals of the first and second impedance converting transistors are driven by the secondary winding of the first transformer. Further, diodes may be connected to the first resistor in parallel, respectively.

In other exemplary embodiments of the present invention, an inverter circuit includes a first transformer having a primary winding to which a first control signal is applied, a second transformer having a primary winding to which a second control signal is applied, a power voltage circuit, a first field effect transistor, a second field effect transistor, a third transformer and a first resistor.

The power voltage circuit generates a predetermined direct current voltage. The first field effect transistor is electrically connected between the power voltage circuit and a driving node and has a gate connected to a secondary winding of the first transformer. The second field effect transistor is electrically connected between the driving node and a ground and has a gate connected to a secondary winding of the second transformer. The third transformer is electrically connected to the driving node and the first resistor is electrically connected to the gate of the first field effect transistor.

The inverter circuit further includes a first impedance converting circuit connected between the secondary winding of the first transformer and the first resistor to reduce an impedance of the first resistor, which is viewed from the first transformer. Since the direct current path does not exist between the gate of the first field effect transistor and the driving node, the gate voltage of the first field effect transistor is biased more to a negative polarity, thereby securing a margin with respect to the shoot-through current when the second field effect transistor is turned on.

The first impedance converting circuit is a push-pull circuit having a first impedance converting transistor and a second impedance converting transistor. Input terminals of the first and second impedance converting transistors are connected to the secondary winding of the first transformer. The first and second impedance converting transistors may be driven by a bias voltage obtained by rectifying an alternating current signal from the secondary winding of the first transformer. The bias voltage is generated using a diode and a capacitor. The inverter circuit further includes a diode that may be electrically connected to the first resistor in parallel.

The inverter circuit may further include a second resistor and a second impedance converting circuit. The second resistor is electrically connected to the gate of the second field effect transistor. The second impedance converting circuit is connected between the secondary winding of the second transformer and the second resistor to reduce an impedance of the second resistor, which is viewed from the second transformer.

According to the above, the direct current path does not exist between the gate of the first field effect transistor and the driving node, so that the gate voltage of the first field effect transistor is more biased to the negative polarity, thereby securing a margin with respect to the shoot-through current when the second field effect transistor is turned on.

Further, when the resistor is connected to the gate of the first field effect transistor and the impedance converting circuit is employed for the first field effect transistor, the inverter circuit may reduce the parasitic capacitance of the transformer, thereby preventing the shoot-through current when the first and second field effect transistors are simultaneously turned on.

BRIEF DESCRIPTION OF THE DRAWINGS

The above and other advantages of the present invention will become readily apparent by reference to the following detailed description when considered in conjunction with the accompanying drawings wherein.

DETAILED DESCRIPTION OF THE INVENTION

Figure 1:
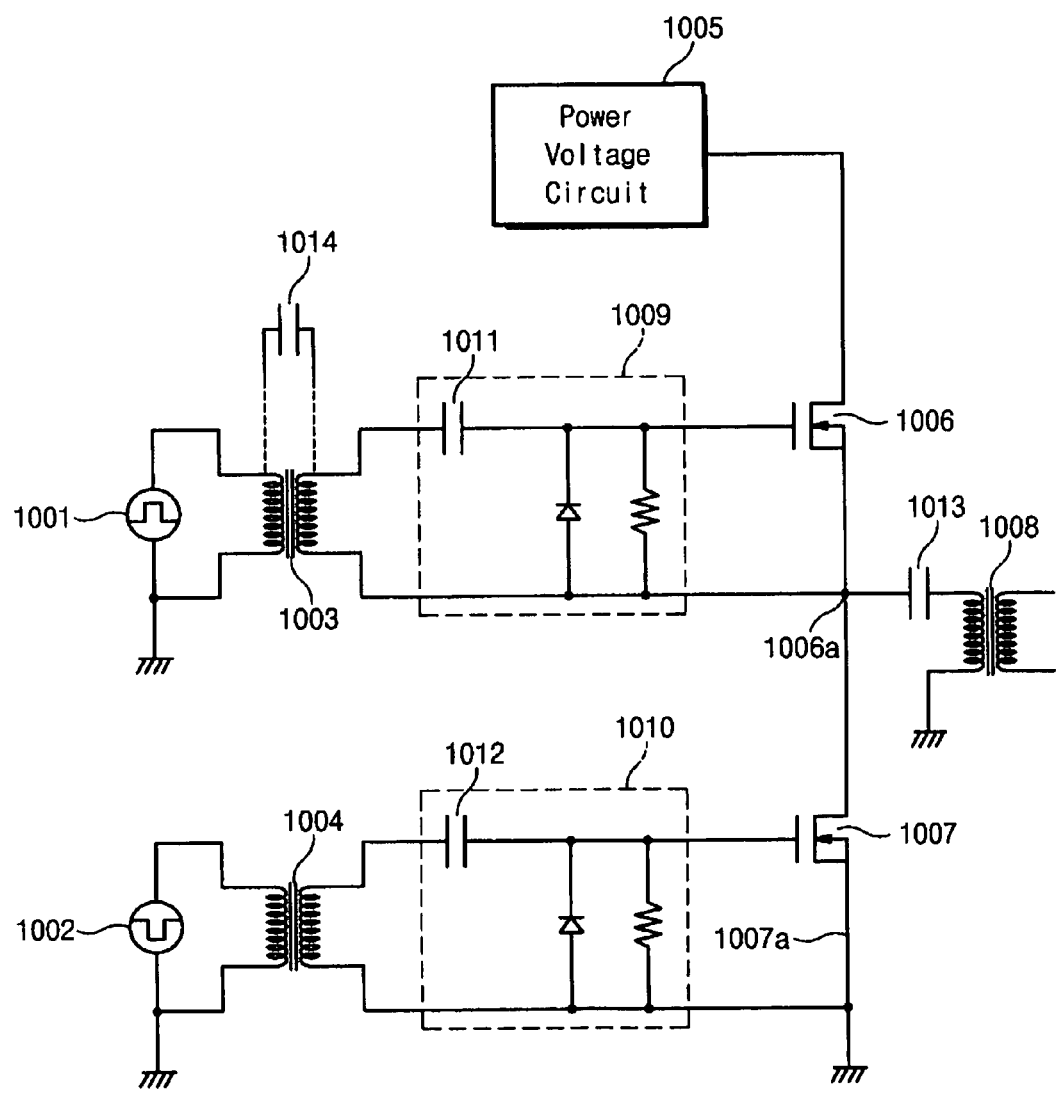
FIG. 1 is a circuit schematic diagram showing a conventional inverter circuit employing an N-channel type FET as the low-side FET and the high-side FET.
Figure 2:
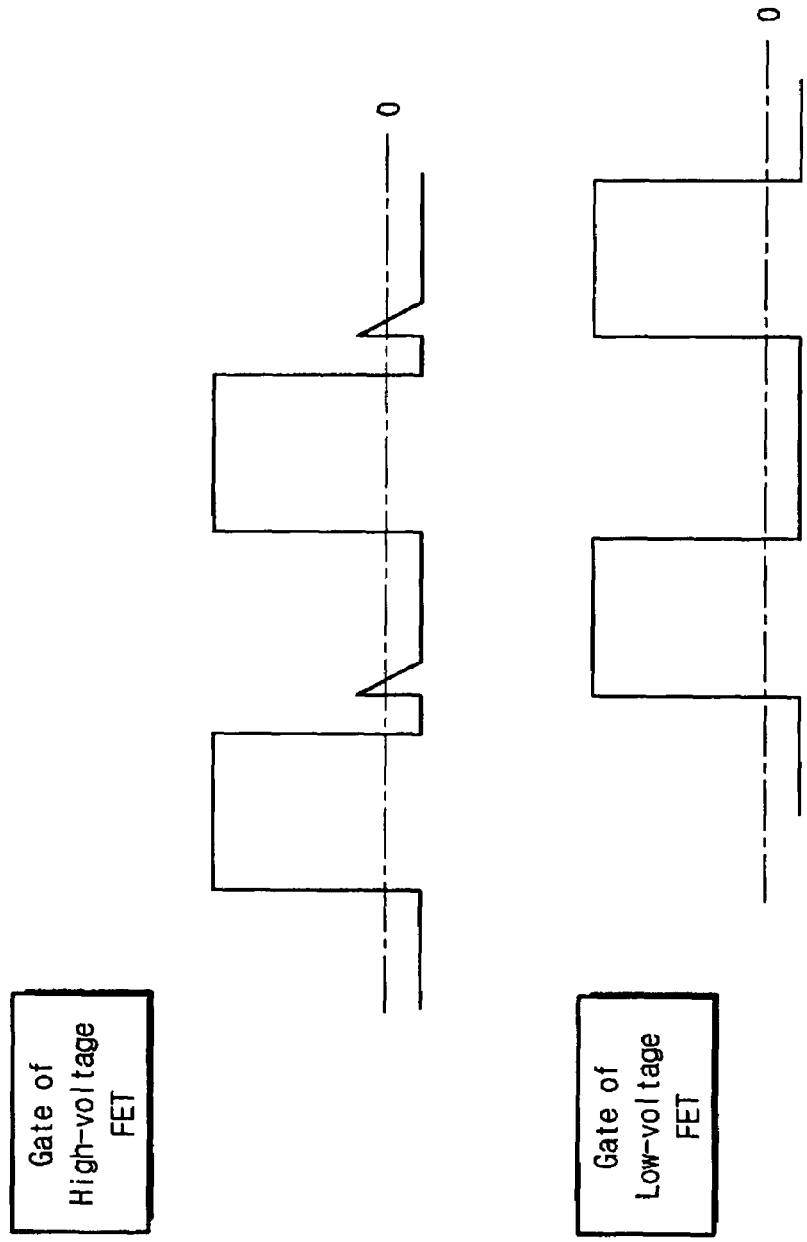
FIG. 2 is a waveform diagram showing gate voltages of the FETs shown in FIG. 1.

It will be understood that when an element or layer is referred to as being "on", "connected to" or "coupled to" another element or layer, it can be directly on, connected to or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms, "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the present invention will be explained in detail with reference to the accompanying drawings.

Figure 3:
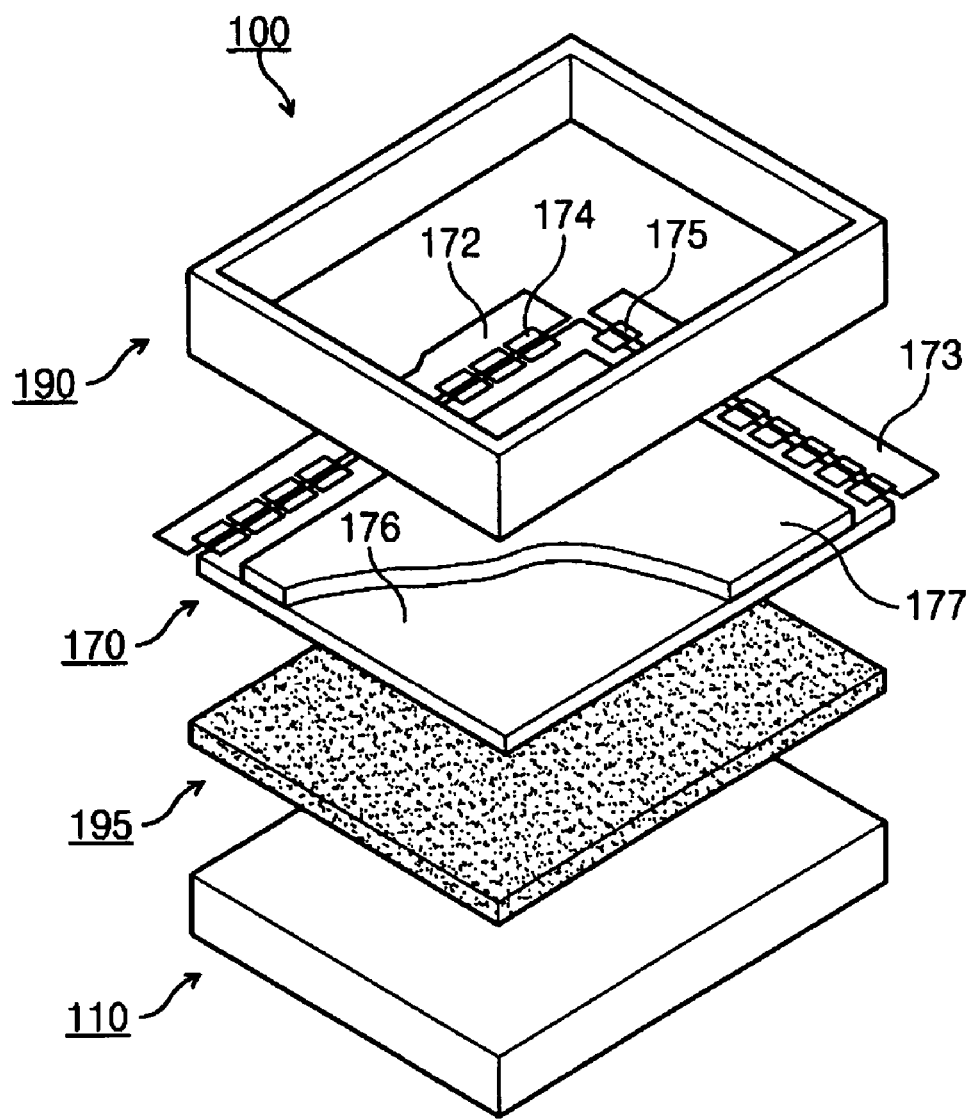
FIG. 3 is an exploded perspective view showing an exemplary embodiment of a liquid crystal display according to the present invention.

FIG. 3 is an exploded perspective view showing an exemplary embodiment of a liquid crystal display according to the present invention.

Referring to FIG. 3, a liquid crystal display 100 includes a case 190, a liquid crystal panel 170 received in the case 190, a diffusing sheet 195 and a backlight assembly 110. The liquid crystal panel 170 includes a thin film transistor ("TFT") substrate 176, a color filter substrate 177 on the TFT substrate 176, driving modules 172 and 173 that drive the TFT substrate 176 and the color filter substrate 177, and connectors 174 and 175 that electrically connect the driving modules 172 and 173 and the TFT substrate 176.

The backlight assembly 110 generates light. The light may be uniform by the diffusion sheet 195 and is applied to the TFT substrate 176. The light passes through the color filter substrate 177 and exits from a front of the case 190. The driving modules 172 and 173 control driving of the TFT substrate 176.

Figure 4:
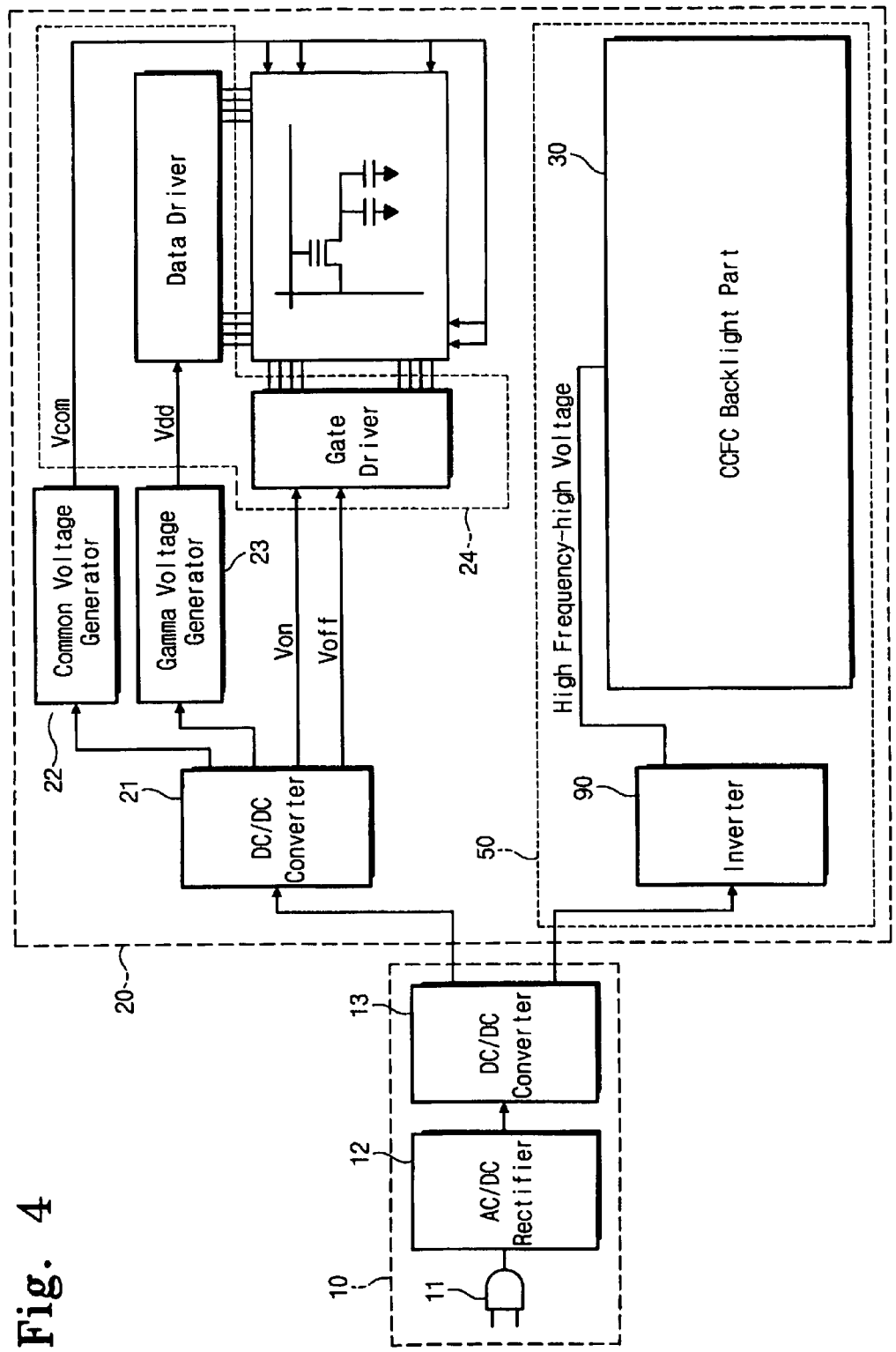
FIG. 4 is a block diagram showing the exemplary embodiment of the liquid crystal display according to the present invention.

FIG. 4 is a block diagram showing an exemplary embodiment of the liquid crystal display according to the present invention.

Referring to FIG. 4, the liquid crystal display 100 broadly includes a power voltage circuit 10, a liquid crystal panel driving circuit 20 and a backlight driving circuit 50.

The power voltage circuit 10 includes an alternating current to direct current (AC/DC) rectifier 12 electrically connected to an AC plug 11 to which an alternating current is applied and a direct current to direct current (DC/DC) converter 13. The DC/DC converter 13 converts an output voltage from the AC/DC rectifier 12 to apply a predetermined voltage to the liquid crystal panel driving circuit 20 and the backlight driving circuit 50.

The liquid crystal panel driving circuit 20 includes a DC/DC converter 21, a common voltage generator 22, a gamma voltage generator 23 and a gate/data driver 24. The DC/DC converter 21 applies a direct-current power voltage to the common voltage generator 22, the gamma voltage generator 23 and the gate/data driver 24. The common voltage generator 22 and the gamma voltage generator 23 apply various voltages to the liquid crystal panel 170 (refer to FIG. 3). The gate/data driver 24 drives gate lines and data lines of the liquid crystal panel 170.

The backlight driving circuit 50 includes a CCFL backlight part 30 having a CCFL backlight array and an inverter 90. The inverter 90 applies a high frequency-high voltage to the CCFL backlight part 30.

Figure 5:
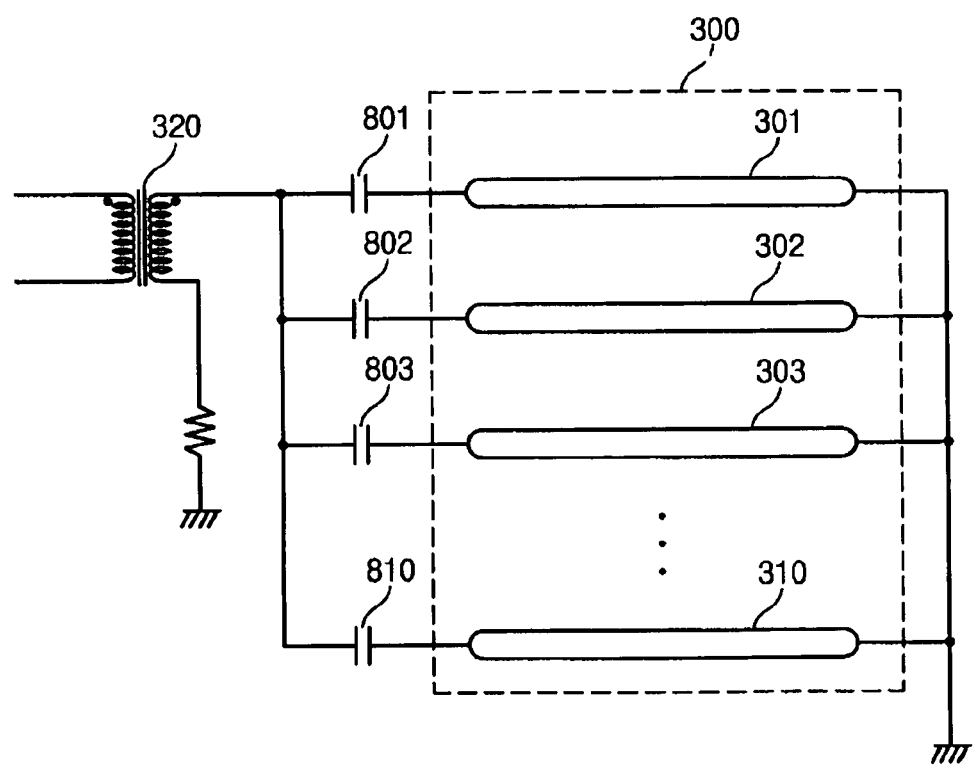
FIG. 5 is a circuit schematic diagram showing the CCFL backlight part of FIG. 4.
Figure 6:
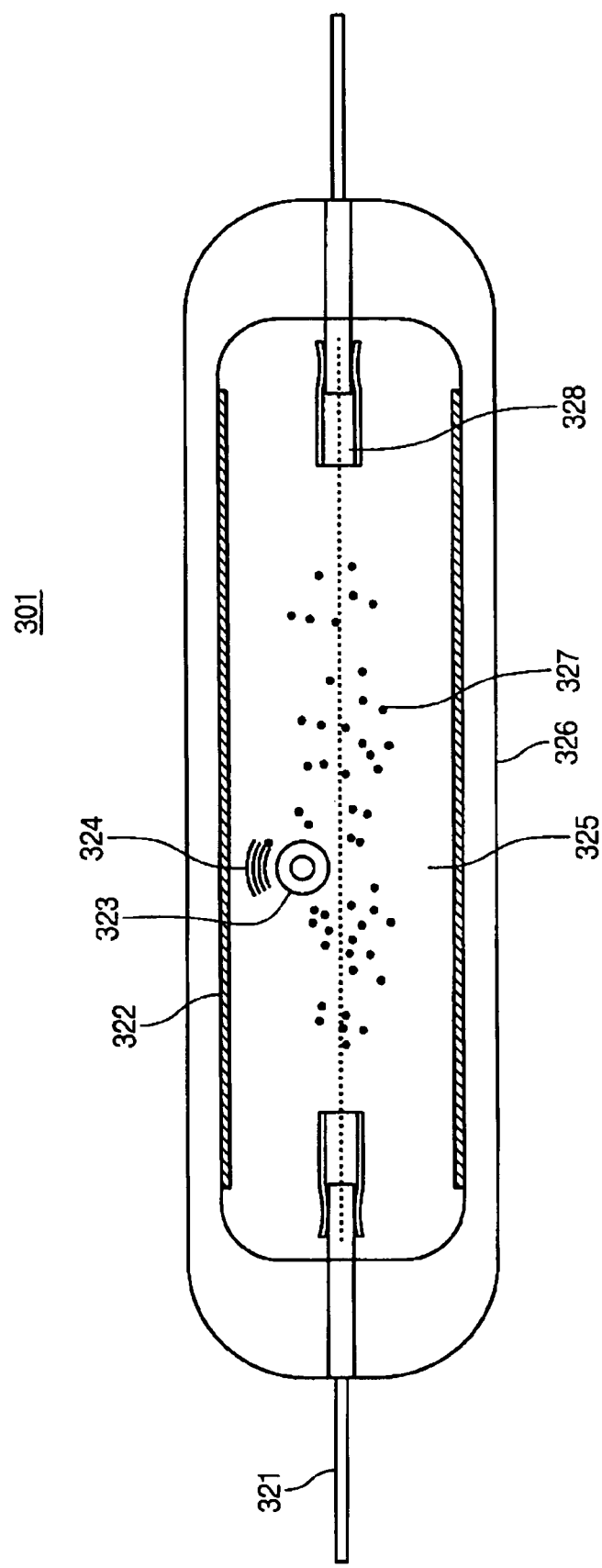
FIG. 6 is a cross-sectional view showing a structure of the CCFL of FIG. 5.

FIG. 5 is a circuit diagram showing the CCFL backlight part 30 of FIG. 4. FIG. 6 is a cross-sectional view showing a structure of the CCFL of FIG. 5.

Referring to FIG. 5, the CCFL backlight part 30 includes a backlight 300 having a plurality of CCFLs 301, 302, 303, . . . , 310 and a plurality of capacitors 801, 802, 803, . . . , 810. First terminals of the capacitors 801, 802, 803, . . . , 810 are electrically connected to first terminals of the CCFLs 301, 302, 303, . . . , 310, respectively, and second terminals of the capacitors 801, 802, 803, . . . , 810 are connected to a secondary winding of an inverter transformer 320. In FIG. 5, second terminals of the CCFLs 301, 302, 303, . . . , 310 are grounded, however, the second terminals of the CCFLs 301, 302, 303, . . . , 310 may be connected to a stabilization circuit (not shown).

As shown in FIG. 6, the CCFL 301 includes a glass tube 326 into which a gas 325 is injected, a lead line 321 coupled to both ends of the glass tube 326 and an electrode 328 coupled to each lead line 321 in the glass tube 326. The CCFL 301 further includes a fluorescent material 322 coated on an inner wall of the glass tube 326. When a high frequency-high voltage is applied to the electrode 328 through the lead line coupled to the both ends of the glass tube 326, electrons are generated in the glass tube 326 into which mercury 323 is injected. The electrons excite the mercury 323 and the excited mercury 323 emits an ultraviolet ray 324. The ultraviolet ray 324 is changed into a white visual ray through the fluorescent material 322, thereby allowing the CCFL 301 to emit the white visual ray.

Figure 7:
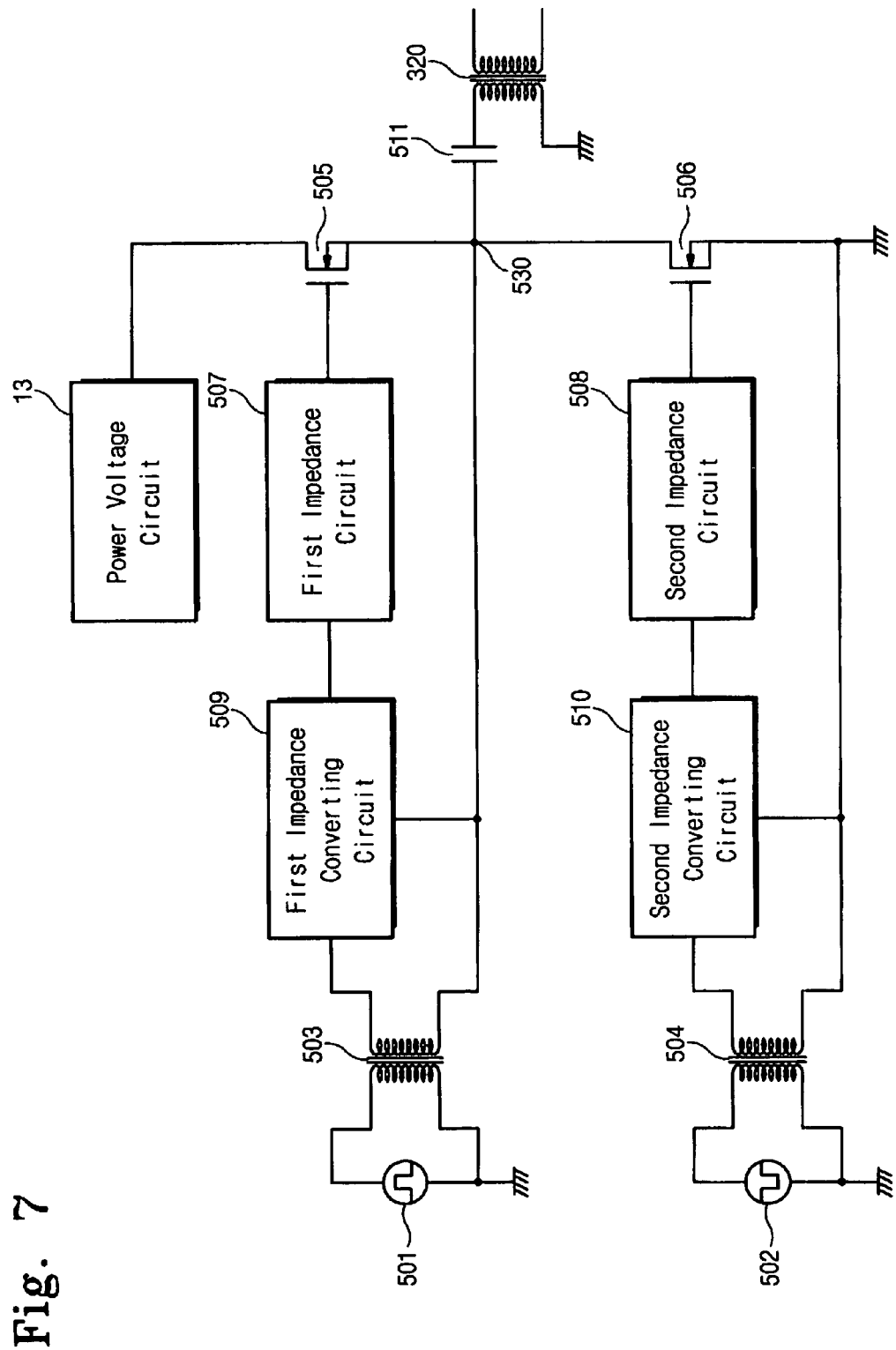
FIG. 7 is a block diagram showing the inverter circuit of FIG. 4.
Figure 8:
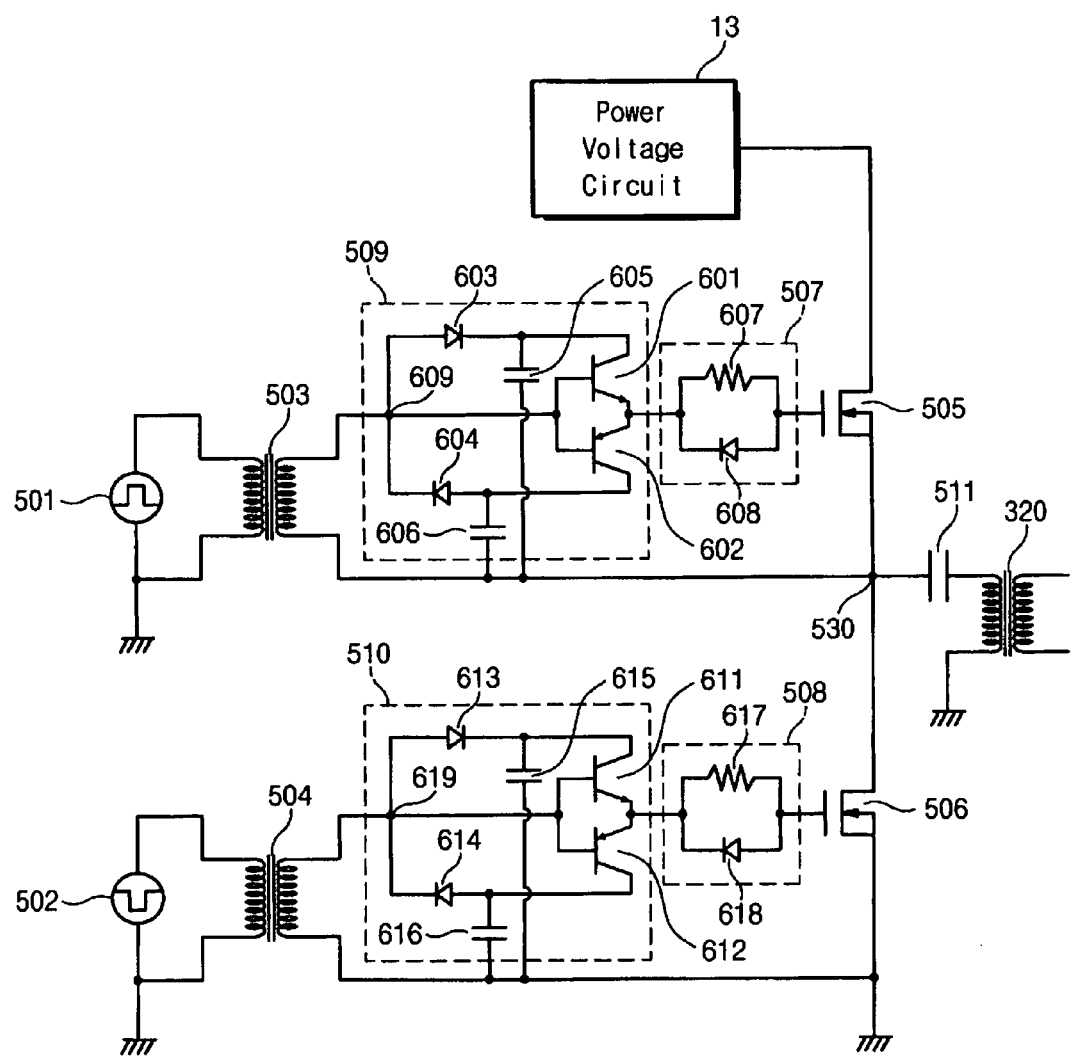
FIG. 8 is a circuit schematic diagram showing a circuit configuration of the inverter circuit of FIG. 7.

FIG. 7 is a block and partial circuit schematic diagram showing the inverter circuit of FIG. 4, and FIG. 8 is a circuit schematic diagram showing a circuit configuration of the inverter circuit of FIG. 7.

Referring to FIG. 7, first and second control signal generating circuits 501 and 502, respectively, output square pulses that are complementary to each other and do not overlap each other. Each of the square pulses has an amplitude of about 12 volts. Outputs of the first and second control signal generating circuits 501 and 502 are electrically connected to primary windings of first and second driving transformers 503 and 504, respectively. A power voltage circuit 13 generates a direct current voltage of about 380 volts. An N-channel type field effect transistor (an N-channel type FET) 505 for a high voltage and an N-channel type FET 506 for a low voltage are electrically connected between the power voltage circuit 13 and a ground. A node between the high-side FET 505 and the low-side FET 506 is defined as a driving node 530. The high-side FET 505 has a gate connected to a secondary winding of the first driving transformer 503 and the low-side FET 506 has a gate connected to a secondary winding of the second driving transformer 504. The driving node 530 between the high-side FET 505 and the low-side FET 506 is electrically connected to a primary winding of the inverter transformer 320, and the secondary winding of the inverter transformer 320 is electrically connected to the CCFLs 301, 302, 303, ..., 310 as shown in FIG. 5. A first impedance converting circuit 509 and a first impedance circuit 507 are connected in series between the first driving transformer 503 and the gate of the high-side FET 505, and a second impedance converting circuit 510 and a second impedance circuit 508 are connected in series between the second driving transformer 504 and the gate of the low-side FET 506. A capacitor 511 is electrically connected between the driving node 530 and the primary winding of the inverter transformer 320 to pass only an alternating current therethrough.

In the inverter circuit shown in FIG. 7, a current path of which a direct current flows from the driving node 530 to the gate of the high-side FET 505 does not exist between the gate of the high-side FET 505 and the driving node 530. Also, the gate of the high-side FET 505 is maintained in a minus voltage level compared to a voltage level at the driving node 530 during one cycle of the square pulse from the first control signal generating circuit 501. As a result, the gate of the high-side FET 505 is more biased in the minus voltage level than when a clamp circuit is applied between the gate of the high-side FET 505 and the driving node 530, and a margin against variation of the gate voltage increases when the low-side FET 506 is turned on.

The first impedance circuit 507 blocks a parasitic capacitance of the first driving transformer 503 to secure a margin with respect to a shoot-through current. However, since the first impedance circuit 507 has an adverse effect on the high-side FET 505 when a high-level voltage is applied to the gate of the high-side FET 507, such as a distortion of a waveform caused by a RC delay, an interference of a high driving speed, etc., the first impedance converting circuit 509 is employed as shown in FIG. 7. The first impedance converting circuit 509 is electrically connected between the secondary winding of the first driving transformer 503 and the first impedance circuit 507 to reduce an impedance of the first impedance circuit 507, which is viewed from the first driving transformer 503.

Thus, the parasitic capacitance of the inverter transformer 320 may be reduced by the first impedance circuit 507, and the first impedance converting circuit 509 does not have the adverse effect on the high-side FET 505 when the high-side FET 505 is turned on. Further, the inverter circuit does not need the clamp circuit, and the current path of which the direct current flows from the driving node 530 to the gate of the high-side FET 505 does not exist between the gate of the high-side FET 505 and the driving node. Therefore, the gate of the high-side FET 505 is more biased in the minus voltage level than when a clamp circuit is applied between the gate of the high-side FET 505 and the driving node 530, and a margin against variation of the gate voltage increases when the low-side FET 506 is turned on.

In the case of the low-side FET 506, the second impedance circuit 508 and the second impedance converting circuit 510 are connected between the second driving transformer 504 and the low-side FET 506.

Referring to FIG. 8, the first impedance converting circuit 509 is a push-pull circuit having an NPN-type bipolar transistor 601 and a PNP-type bipolar transistor 602. The NPN-type bipolar transistor 601 includes an emitter electrically connected in series to an emitter of the PNP-type bipolar transistor 602. Each NPN-type bipolar transistor 601 and the PNP-type bipolar transistor 602 includes a base commonly connected to a node 609. A rectifying circuit having a diode 603 and a capacitor 605 is connected between a collector of the NPN-type bipolar transistor 601 and the node 609, and a positive direct current voltage with respect to a source voltage of the high-side FET 505 is applied to the collector of the NPN-type bipolar transistor 601. A rectifying circuit having a diode 604 and a capacitor 606 is connected between a collector of the PNP-type bipolar transistor 602 and the node 609, and a negative direct current voltage with respect to the source voltage of the high-side FET 505 is applied to the collector of the PNP-type bipolar transistor 602.

In order to stably maintain the negative direct current voltage of the push-pull circuit, the capacitor 606 connected to the collector of the PNP-type bipolar transistor 602 has a capacitance larger than that of the capacitor 605 connected to the collector of the NPN-type bipolar transistor 601.

The first impedance circuit 507 includes a resistor 607 and a diode 608 connected to the resistor 607 in parallel. The resistor 607 has a resistance within a range from about 100 ohms to about 500 ohms. In the preset exemplary embodiment, the resistor 607 has a resistance of about 220 ohms. The resistor 607 blocks the effect of the parasitic capacitance on the high-side FET 505 and may apply an off signal to the high-side FET 505 with the diode 608.

The second impedance converting circuit 510 is also a push-pull circuit having an NPN-type bipolar transistor 611 and a PNP-type bipolar transistor 612. The NPN-type bipolar transistor 611 includes an emitter electrically connected in series to an emitter of the PNP-type bipolar transistor 612. Each NPN-type bipolar transistor 611 and the PNP-type bipolar transistor 612 includes a base commonly connected to a node 619. A rectifying circuit having a diode 613 and a capacitor 615 is connected between a collector of the NPN-type bipolar transistor 611 and the node 619, and a positive direct current voltage is applied to the collector of the NPN-type bipolar transistor 611. A rectifying circuit having a diode 614 and a capacitor 616 is connected between a collector of the PNP-type bipolar transistor 612 and the node 619, and a negative direct current voltage is applied to the collector of the PNP-type bipolar transistor 612.

Also, the second impedance circuit 508 includes a resistor 617 and a diode 618 electrically connected to the resistor 617 in parallel.

As described above, the push-pull circuit may properly convert the impedance and the bias of the push-pull circuit is decided by the rectifying circuit, so that the push-pull circuit does not need an additional power voltage circuit. Further, since the high-side FET 505 and the low-side FET 506 have a same circuit configuration as each other, the inverter circuit may be stably operated.

Figure 9A:
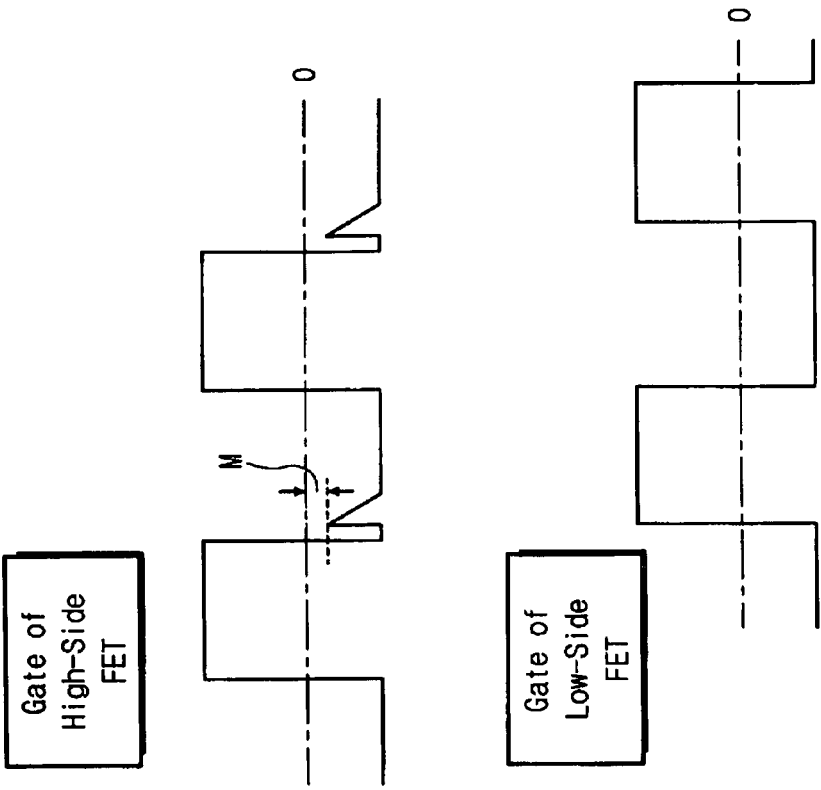
FIGS. 9A and 9B are waveform diagrams illustrating a function of the inverter circuit shown in FIG. 8.
Figure 9B:
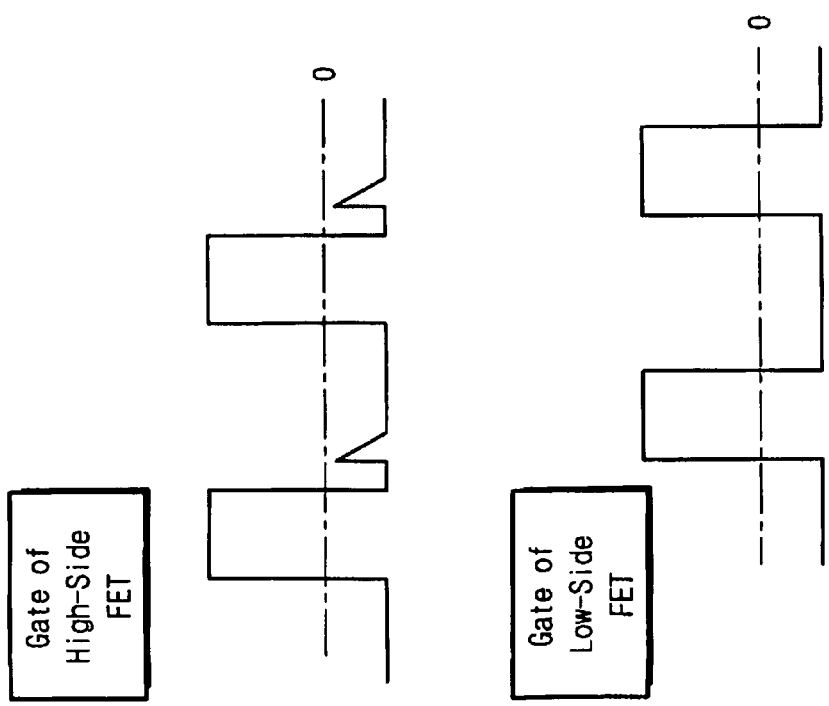

FIGS. 9A and 9B are waveform diagrams illustrating a function of the inverter circuit shown in FIG. 8. FIG. 9A shows a waveform when a pulse width is relatively narrower than a pulse width of FIG. 9B and a clamp circuit is not applied for the inverter circuit. FIG. 9B shows a waveform when the pulse width is relatively wider than the pulse width of FIG. 9A and the clamp circuit is not applied for the inverter circuit.

Referring to FIG. 9A, the gate voltage of the high-side FET 505 is relatively biased to a negative polarity. That is, a negative voltage portion of the pulse becomes larger and the gate voltage, which is temporarily increased due to the parasitic capacitance, may be reduced, thereby securing the margin with respect to the shoot-through current.

In FIG. 9B, when the pulse width becomes wider, the negative voltage portion of the pulse becomes larger. As a result, the gate voltage of the high-side FET 505 is biased more to the negative polarity. The gate voltage that is temporarily increased due to the parasitic capacitance may also be reduced, thereby securing enough margin (M) with respect to the shoot-through current.

Figure 10:
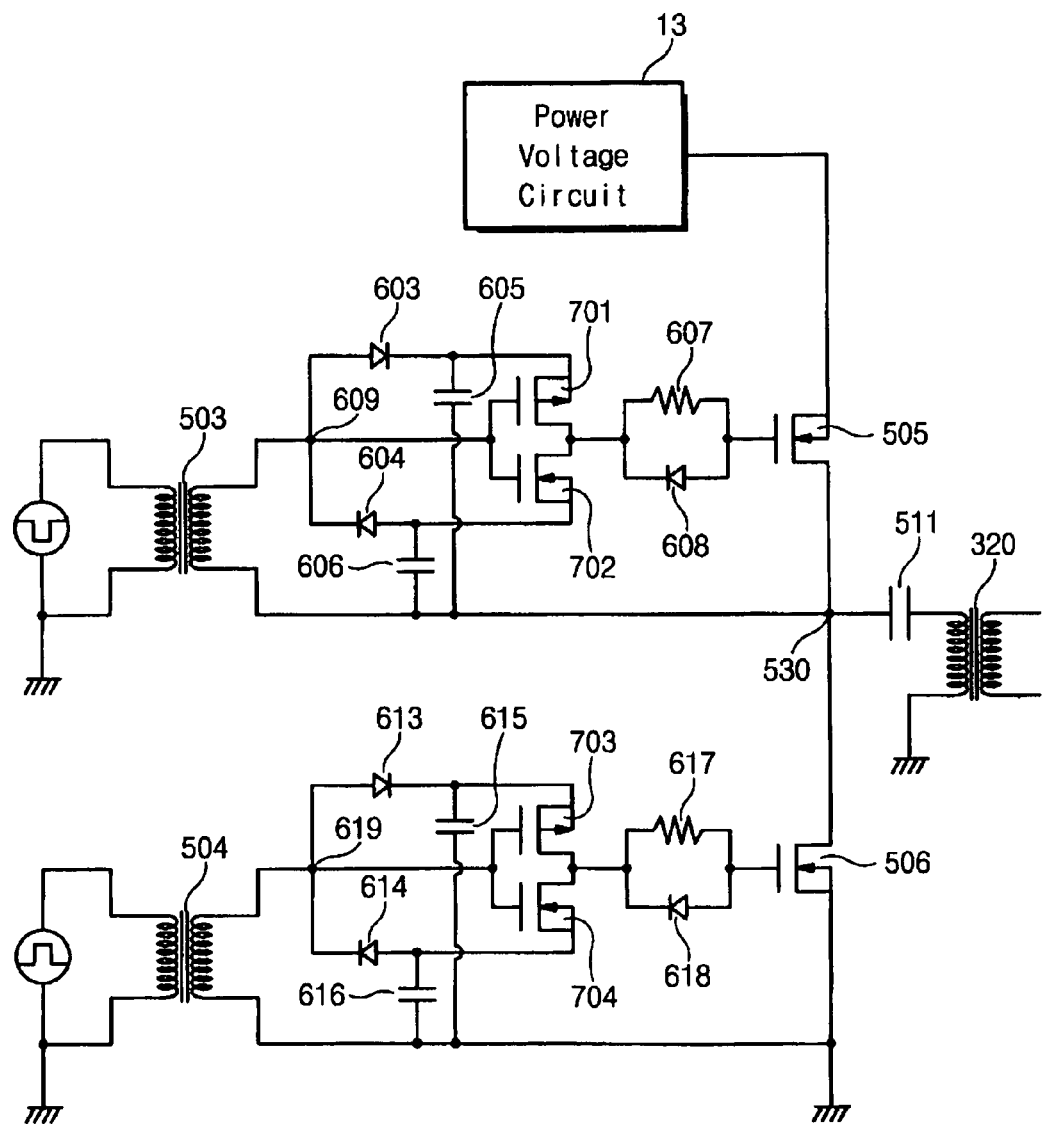
FIG. 10 is a circuit diagram showing another exemplary embodiment of an inverter circuit according to the present invention.

FIG. 10 is another exemplary embodiment of a circuit schematic diagram showing an inverter circuit according to the present invention. In FIG. 10 the same reference numerals denote the same elements as in FIG. 8, and thus the detailed descriptions of the same elements will be omitted.

As shown in FIG. 10, the bipolar transistors in the push-pull circuit of FIG. 8 are replaced with FETs. Particularly, the NPN-type bipolar transistor 601 and the PNP-type bipolar transistor 602 of the first impedance converting circuit 509 are replaced with a P-channel type FET 701 and an N-channel type FET 702, respectively. Similarly, the NPN-type bipolar transistor 611 and the PNP-type bipolar transistor 612 of the second impedance converting circuit 510 are replaced with a P-channel type FET 703 and an N-channel type FET 704, respectively.

Figure 11:
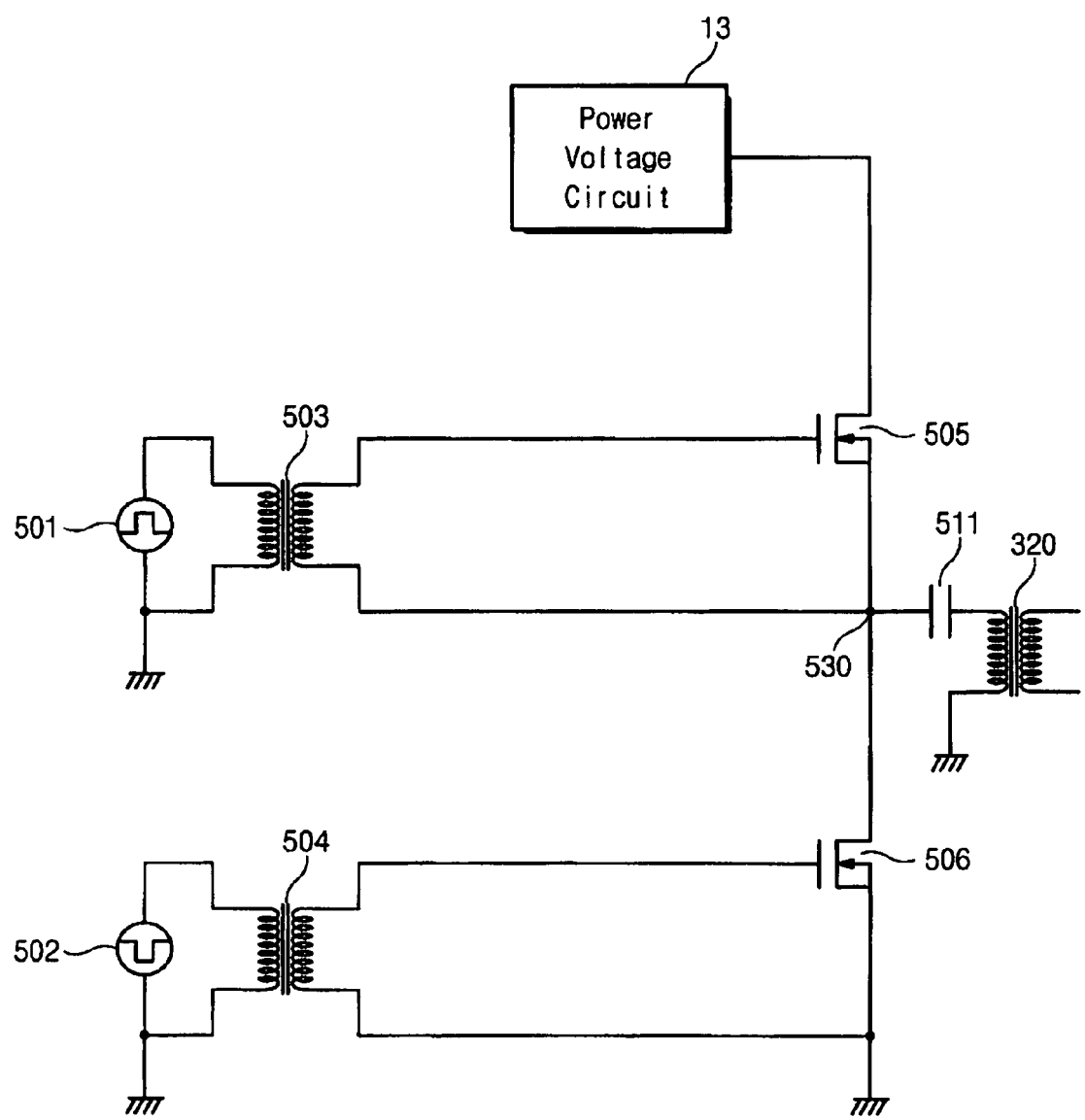
FIG. 11 is a circuit schematic diagram showing yet another exemplary embodiment of an inverter circuit according to the present invention.

FIG. 11 is another exemplary embodiment of a circuit schematic diagram showing an inverter circuit according to the present invention. In FIG. 11 the same reference numerals denote the same elements as in FIG. 8, and thus the detailed descriptions of the same elements will be omitted.

Referring to FIG. 11, first and second control signal generating circuits 501 and 502, respectively, output square pulses that are complementary to each other and do not overlap each other. Outputs of the first and second control signal generating circuits 501 and 502 are electrically connected to primary windings of first and second driving transformers 503 and 504, respectively. A power voltage circuit 13 generates a direct current voltage. An N-channel type FET 505 for a high voltage and an N-channel type FET 506 for a low voltage are electrically connected between the power voltage circuit 13 and a ground. A node between the high-side FET 505 and the low-side FET 506 is defined as a driving node 530. The high-side FET 505 has a gate connected to a secondary winding of the first driving transformer 503 and the low-side FET 506 has a gate connected to a secondary winding of the second driving transformer 504. The driving node 530 between the high-side FET 505 and the low-side FET 506 is electrically connected to a primary winding of the inverter transformer 320 through a capacitor 511. The secondary winding of the inverter transformer 320 is electrically connected to the CCFLs 301, 302, 303, ..., 310 as shown in FIG. 5. The capacitor 511 is electrically connected between the driving node 530 and the primary winding of the inverter transformer 320 to pass only an alternating current therethrough.

Although the inverter circuit shown in FIG. 11 is very simplified, a current path of which a direct current flows from the driving node 530 to the gate of the high-side FET 505 does not exist between the gate of the high-side FET 505 and the driving node 530. Also, the gate of the high-side FET 505 is maintained in a minus voltage level compared to a voltage level at the driving node 530 during one cycle of the square pulse from the first control signal generating circuit 501. As a result, the gate of the high-side FET 505 is biased more in the minus voltage level than when a clamp circuit is applied between the gate of the high-side FET 505 and the driving node 530, and a margin against variation of the gate voltage increases when the low-side FET 506 is turned on.

As described above, the power voltage from the power voltage circuit maintains a stable state, to thereby reduce capacity of the power voltage circuit and provide the stable inverter circuit. Thus, the inverter circuit may be applied for use with a backlight of various displays, such as a liquid crystal display, a liquid crystal monitor, a liquid crystal television set, etc.

Further, the inverter circuit is a complementary type inverter circuit having only the N-channel type FETs. Thus, the inverter circuit may reduce the shoot-through current caused by the parasitic capacitance of the driving transformer, thereby stably generating the power voltage from the power voltage circuit and reducing the capacity of the power voltage circuit.

Although the exemplary embodiments of the present invention have been described, it is understood that the present invention should not be limited to these exemplary embodiments but various changes and modifications can be made by one ordinary skilled in the art within the spirit and scope of the present invention as hereinafter claimed.

What is claimed is:

1. An inverter circuit comprising:
a first transformer having a primary winding to which a first control signal is applied;
a second transformer having a primary winding to which a second control signal is applied;
a power voltage circuit to generate a predetermined direct current voltage;
a first field effect transistor electrically connected between the power voltage circuit and a driving node, the first field effect transistor having a gate connected to a secondary winding of the first transformer;
a second field effect transistor electrically connected between the driving node and a ground, the second field effect transistor having a gate connected to a secondary winding of the second transformer; and
a third transformer electrically connected to the driving node, wherein a voltage level applied to the gate of the first field effect transistor is maintained in a minus voltage level compared to a voltage level at the driving node during one cycle of the first control signal such that no direct current path exists between the gate of the first field effect transistor and the driving node.

2. The inverter circuit of claim 1, wherein an absolute value of the minus voltage level increases as a pulse width of the first control signal increases.

3. The inverter circuit of claim 2, further comprising:
a first impedance converting circuit and a first resistor connected in series between the secondary winding of the first transformer and the gate of the first field effect transistor, the first impedance converting circuit making an impedance of the first transformer lower than an impedance of the first resistor; and
a second impedance converting circuit and a second resistor connected in series between the secondary winding of the second transformer and the gate of the second field effect transistor, the second impedance converting circuit making an impedance of the second transformer lower than an impedance of the second resistor.

4. The inverter circuit of claim 3, wherein the first impedance converting circuit is a push-pull circuit having a first impedance converting transistor and a second impedance converting transistor connected to each other in series, and input terminals of the first and second impedance converting transistors are driven by the secondary winding of the first transformer.

5. The inverter circuit of claim 3, further comprising diodes each connected in parallel to a respective one of the first and second resistors.

6. The inverter circuit of claim 1, further comprising a capacitor electrically connected between a primary winding of the third transformer and the driving node.

7. The inverter circuit of claim 6, further comprising:
a first impedance converting circuit and a first resistor connected in series between the secondary winding of the first transformer and the gate of the first field effect transistor, the first impedance converting circuit making an impedance of the first transformer lower than an impedance of the first resistor; and
a second impedance converting circuit and a second resistor connected in series between the secondary winding of the second transformer and the gate of the second field effect transistor, the second impedance converting circuit making an impedance of the second transformer lower than an impedance of the second resistor.

8. The inverter circuit of claim 1, further comprising:
a first impedance converting circuit and a first resistor connected in series between the secondary winding of the first transformer and the gate of the first field effect transistor, the first impedance converting circuit making an impedance of the first transformer lower than an impedance of the first resistor; and
a second impedance converting circuit and a second resistor connected in series between the secondary winding of the second transformer and the gate of the second field effect transistor, the second impedance converting circuit making an impedance of the second transformer lower than an impedance of the second resistor.

9. The inverter circuit of claim 8, wherein the first impedance converting circuit is a push-pull circuit having a first impedance converting transistor and a second impedance converting transistor connected to each other in series, and input terminals of the first and second impedance converting transistors are driven by the secondary winding of the first transformer.

10. The inverter circuit of claim 8, further comprising diodes each connected in parallel to a respective one of the first and second resistors.

11. An inverter circuit comprising:
a first transformer having a primary winding to which a first control signal is applied;
a second transformer having a primary winding to which a second control signal is applied;
a power voltage circuit to generate a predetermined direct current voltage;
a first field effect transistor electrically connected between the power voltage circuit and a driving node, the first field effect transistor having a gate connected to a secondary winding of the first transformer;
a second field effect transistor electrically connected between the driving node and a ground, the second field effect transistor having a gate connected to a secondary winding of the second transformer;
a third transformer electrically connected to the driving node; and
a first resistor electrically connected to the gate of the first field effect transistor,
wherein a first impedance converting circuit is connected between the secondary winding of the first transformer and the first resistor to reduce an impedance of the first resistor, which is viewed from the first transformer.

12. The inverter circuit of claim 11, wherein the first impedance converting circuit is a push-pull circuit having a first impedance converting transistor and a second impedance converting transistor, and input terminals of the first and second impedance converting transistors are connected to the secondary winding of the first transformer.

13. The inverter circuit of claim 12, wherein the first and second impedance converting transistors are driven by a bias voltage obtained by rectifying an alternating current signal from the secondary winding of the first transformer.

14. The inverter circuit of claim 13, further comprising a diode and a capacitor to generate the bias voltage.

15. The inverter circuit of claim 11, further comprising a diode electrically connected to the first resistor in parallel.

16. The inverter circuit of claim 11, further comprising:
a second resistor electrically connected to the gate of the second field effect transistor; and
a second impedance converting circuit connected between the secondary winding of the second transformer and the second resistor to reduce an impedance of the second resistor, which is viewed from the second transformer.

17. The inverter circuit of claim 16, wherein the first impedance converting circuit is a push-pull circuit having a first impedance converting transistor and a second impedance converting transistor, and input terminals of the first and second impedance converting transistors are connected to the secondary winding of the first transformer, and
the second impedance converting circuit is a push-pull circuit having a third impedance converting transistor and a fourth impedance converting transistor, and input terminals of the third and fourth impedance converting transistors are connected to the secondary winding of the second transformer.

18. The inverter circuit of claim 17, wherein the first and second impedance converting transistors are driven by a first bias voltage obtained by rectifying an alternating current signal from the secondary winding of the first transformer, and the third and fourth impedance converting transistors are driven by a second bias voltage obtained by rectifying an alternating current signal from the secondary winding of the second transformer.

19. The inverter circuit of claim 18, further comprising a diode and a capacitor to generate the first and second bias voltages.

20. The inverter circuit of claim 16, further comprising:
a first diode electrically connected to the first resistor in parallel; and
a second diode electrically connected to the second resistor in parallel.

21. A liquid crystal display comprising:
an inverter circuit to generate a power voltage;
a backlight assembly to generate light in response to the power voltage from the inverter circuit; and
a liquid crystal display panel that receives the light from the backlight assembly and image data to display an image, the inverter circuit comprises:
 a first transformer having a primary winding to which a first control signal is applied;
 a second transformer having a primary winding to which a second control signal is applied;
 a power voltage circuit to generate a predetermined direct current voltage;
 a first field effect transistor electrically connected between the power voltage circuit and a driving node, the first field effect transistor having a gate connected to a secondary winding of the first transformer;
 a second field effect transistor electrically connected between the driving node and a ground, the second field effect transistor having a gate connected to a secondary winding of the second transformer; and
 a third transformer electrically connected to the driving node,
 wherein a voltage level applied to the gate of the first field effect transistor is maintained in a minus voltage level compared to a voltage level at the driving node during one cycle of the first control signal such that no direct current path exists between the gate of the first field effect transistor and the driving node.

* * * * *